United States Patent
Chi et al.

(10) Patent No.: US 9,558,965 B2
(45) Date of Patent: Jan. 31, 2017

(54) SEMICONDUCTOR DEVICE WITH THIN PROFILE WLCSP WITH VERTICAL INTERCONNECT OVER PACKAGE FOOTPRINT

(75) Inventors: HeeJo Chi, Kyoungki-do (KR); NamJu Cho, Gyeonggi-do (KR); HanGil Shin, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 13/403,889

(22) Filed: Feb. 23, 2012

(65) Prior Publication Data

US 2012/0153467 A1 Jun. 21, 2012

Related U.S. Application Data

(62) Division of application No. 12/696,923, filed on Jan. 29, 2010, now Pat. No. 8,138,014.

(51) Int. Cl.
*H01L 23/02* (2006.01)
*H01L 21/50* (2006.01)
(Continued)

(52) U.S. Cl.
CPC .............. *H01L 21/50* (2013.01); *H01L 21/78* (2013.01); *H01L 23/3114* (2013.01);
(Continued)

(58) Field of Classification Search
CPC ...... H01L 21/50; H01L 21/78; H01L 23/3114; H01L 23/552; H01L 24/19; H01L 29/94; H01L 24/97; H01L 25/0652; H01L 25/0657; H01L 2224/0401; H01L 2224/04105; H01L 2224/0557; H01L 2224/06181; H01L 2224/12105; H01L 2224/1403; H01L 2224/14181; H01L 2224/16145; H01L 2224/73209; H01L 2224/73253; H01L 2224/73259; H01L 2224/81005; H01L 2224/9222; H01L 2224/94; H01L 2224/97; H01L 2924/01322; H01L 2924/12041; H01L 2924/12042; H01L 2924/1306; H01L 2924/13091; H01L 2924/14; H01L 2924/15311; H01L 2924/181; H01L 2924/18161; H01L 2924/18162; H01L 2924/19104; H01L 2924/19105; H01L 2924/3025; H01L 2924/00; H01L 2924/81; H01L 2924/00012
(Continued)

(56) References Cited

U.S. PATENT DOCUMENTS 5,250,843 A 10/1993 Eichelberger
5,353,498 A 10/1994 Fillion et al.
(Continued)

FOREIGN PATENT DOCUMENTS

| CN | 101409241 A | 4/2009 |
|---|---|---|
| TW | 200926312 A | 6/2009 |
| TW | 200929388 A | 7/2009 |

*Primary Examiner* — Thanh T Nguyen
(74) *Attorney, Agent, or Firm* — Robert D. Atkins; Patent Law Group: Atkins and Associates, P.C.

(57) ABSTRACT

A semiconductor wafer has a plurality of first semiconductor die. A second semiconductor die is mounted to the first semiconductor die. The active surface of the first semiconductor die is oriented toward an active surface of the second semiconductor die. An encapsulant is deposited over the first and second semiconductor die. A portion of a back surface of the second semiconductor die opposite the active surface is removed. Conductive pillars are formed around the second semiconductor die. TSVs can be formed through the first semiconductor die. An interconnect structure is formed over the back surface of the second semiconductor die, encapsulant, and conductive pillars. The interconnect struc-
(Continued)

ture is electrically connected to the conductive pillars. A portion of a back surface of the first semiconductor die opposite the active surface is removed. A heat sink or shielding layer can be formed over the back surface of the first semiconductor die.

19 Claims, 14 Drawing Sheets

(51) Int. Cl.
    *H01L 21/78*     (2006.01)
    *H01L 23/552*     (2006.01)
    *H01L 23/00*     (2006.01)
    *H01L 25/065*     (2006.01)
    *H01L 23/31*     (2006.01)

(52) U.S. Cl.
    CPC ............ *H01L 23/552* (2013.01); *H01L 24/19* (2013.01); *H01L 24/94* (2013.01); *H01L 24/97* (2013.01); *H01L 25/0652* (2013.01); *H01L 25/0657* (2013.01); *H01L 2224/0401* (2013.01); *H01L 2224/04105* (2013.01); *H01L 2224/0557* (2013.01); *H01L 2224/06181* (2013.01); *H01L 2224/12105* (2013.01); *H01L 2224/1403* (2013.01); *H01L 2224/14181* (2013.01); *H01L 2224/16145* (2013.01); *H01L 2224/73209* (2013.01); *H01L 2224/73253* (2013.01); *H01L 2224/73259* (2013.01); *H01L 2224/81005* (2013.01); *H01L 2224/9222* (2013.01); *H01L 2224/94* (2013.01); *H01L 2224/97* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/15311* (2013.01); *H01L 2924/181* (2013.01); *H01L 2924/18161* (2013.01); *H01L 2924/18162* (2013.01); *H01L 2924/19104* (2013.01); *H01L 2924/19105* (2013.01); *H01L 2924/3025* (2013.01)

(58) Field of Classification Search
    USPC .................................................. 257/686, 777
    See application file for complete search history.

(56) References Cited

U.S. PATENT DOCUMENTS

| | | |
|---|---|---|
| 5,811,879 A | 9/1998 | Akram |
| 5,841,193 A | 11/1998 | Eichelberger |
| 6,204,562 B1 | 3/2001 | Ho et al. |
| 6,582,991 B1 | 6/2003 | Maeda et al. |
| 6,607,970 B1 | 8/2003 | Wakabayashi |
| 6,958,537 B2 | 10/2005 | Eng et al. |
| 6,960,826 B2 | 11/2005 | Ho et al. |
| 7,084,513 B2 | 8/2006 | Matsuki et al. |
| 7,221,059 B2 | 5/2007 | Farnworth et al. |
| 7,247,518 B2 * | 7/2007 | Shibata ..................... 438/108 |
| 7,335,994 B2 | 2/2008 | Klein et al. |
| 7,439,098 B2 | 10/2008 | Yang et al. |
| 7,614,888 B2 | 11/2009 | Tong et al. |
| 7,619,901 B2 | 11/2009 | Eichelberger et al. |
| 8,138,014 B2 | 3/2012 | Chi et al. |
| 8,446,017 B2 | 5/2013 | Paek et al. |
| 2003/0080410 A1* | 5/2003 | Shibata ..................... 257/700 |
| 2004/0115867 A1 | 6/2004 | Shibata |
| 2004/0214373 A1 | 10/2004 | Jiang et al. |
| 2004/0238934 A1* | 12/2004 | Warner et al. ................ 257/686 |
| 2005/0029644 A1* | 2/2005 | Ho et al. ....................... 257/686 |
| 2006/0128069 A1 | 6/2006 | Hsu |
| 2007/0108580 A1 | 5/2007 | Goller |
| 2008/0017968 A1* | 1/2008 | Choi et al. .................... 257/686 |
| 2008/0230898 A1 | 9/2008 | Meguro et al. |
| 2009/0091022 A1* | 4/2009 | Meyer et al. ................. 257/723 |
| 2009/0140442 A1 | 6/2009 | Lin |
| 2009/0170241 A1 | 7/2009 | Shim et al. |
| 2009/0258459 A1 | 10/2009 | Gerber et al. |
| 2010/0233831 A1 | 9/2010 | Pohl et al. |
| 2010/0320585 A1 | 12/2010 | Jiang et al. |
| 2011/0068427 A1* | 3/2011 | Paek et al. .................... 257/433 |
| 2011/0147911 A1 | 6/2011 | Kohl et al. |
| 2013/0193574 A1* | 8/2013 | Farooq et al. ................ 257/741 |
| 2013/0288430 A1* | 10/2013 | Meguro et al. ............... 438/108 |

* cited by examiner

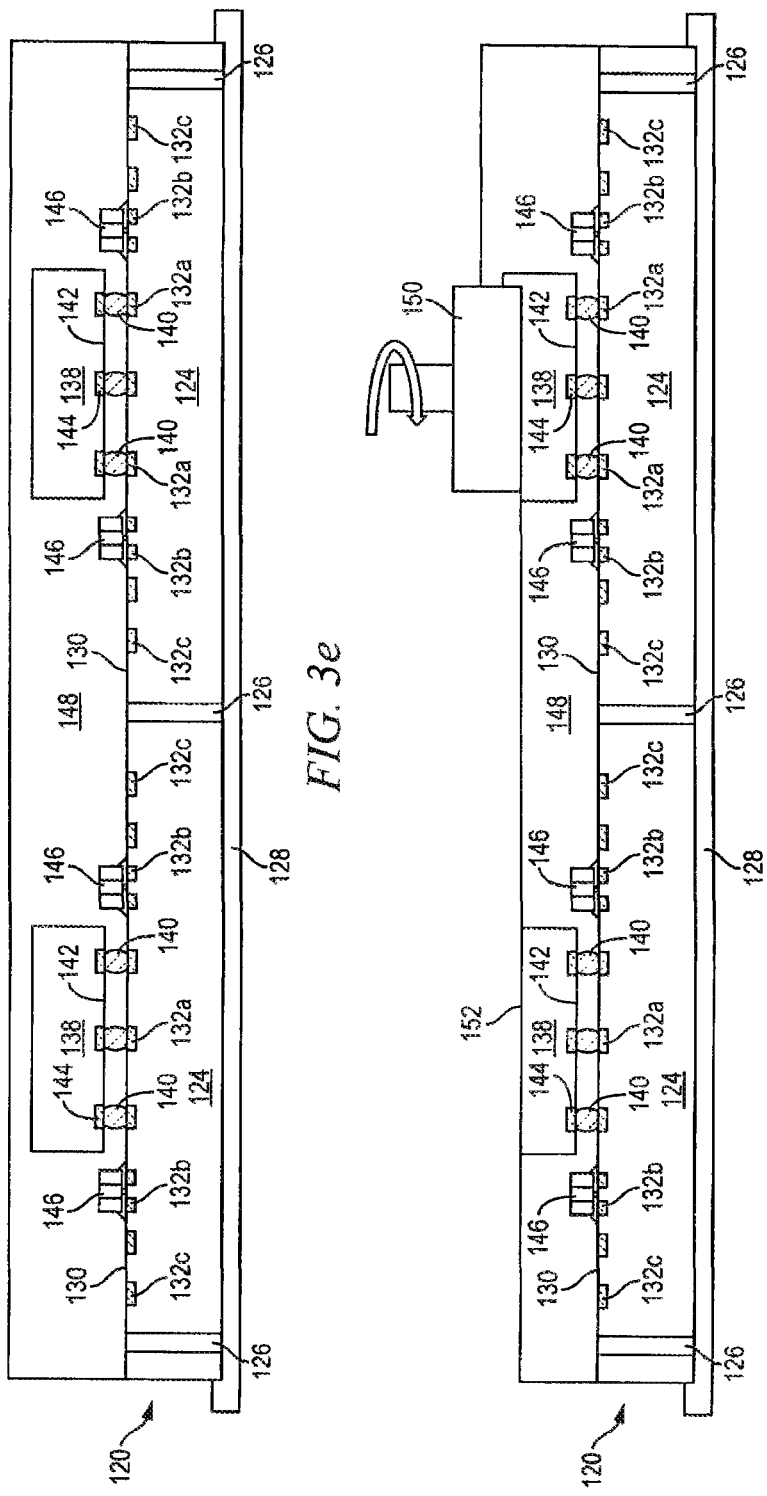

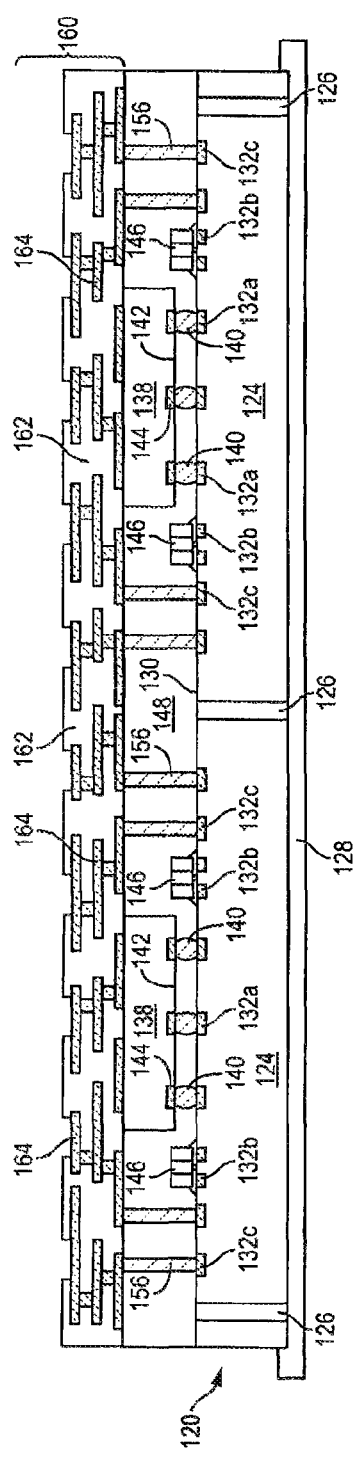
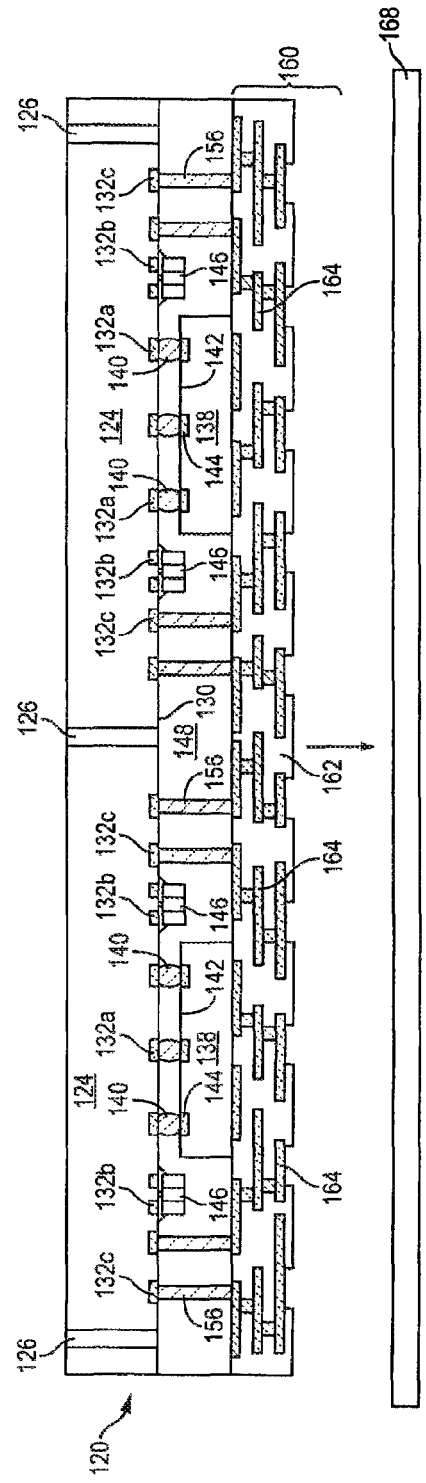

SEMICONDUCTOR DEVICE WITH THIN PROFILE WLCSP WITH VERTICAL INTERCONNECT OVER PACKAGE FOOTPRINT

CLAIM TO DOMESTIC PRIORITY

The present application is a division of U.S. patent application Ser. No. 12/696,923, now U.S. Pat. No. 8,138,014, filed Jan. 29, 2010, and claims priority to the foregoing parent application pursuant to 35 U.S.C. §121.

FIELD OF THE INVENTION

The present invention relates in general to semiconductor devices and, more particularly, to a semiconductor device and method of forming a thin profile WLCSP containing face to face semiconductor die with vertical interconnect capability over the entire package footprint.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a wafer level chip scale package (WLCSP) containing stacked semiconductor die, the vertical electrical interconnection can be accomplished with conductive through silicon vias (TSV), through hole vias (THV), or Cu-plated conductive pillars in the encapsulant. It is desirable to make the WLCSP as thin as practicable. At the same time, the vertical interconnect capability should be maximized. TSVs consume silicon area and reduce active surface area for circuits. In the case of THVs or conductive pillars in the encapsulant, the WLCSP has only limited vertical interconnect around a perimeter of the lower semiconductor die because there is no vertical interconnect within the foot-print of the lower die. The thin profile requirement limits the vertical interconnect capability by reducing areas to form the vertical interconnections.

SUMMARY OF THE INVENTION

A need exists for thin profile WLCSP with greater vertical interconnect capability. Accordingly, in one embodiment, the present invention is a semiconductor device including a first semiconductor die having a first thickness during fabrication and a second semiconductor die having a first thickness during fabrication. The second semiconductor die is mounted to the first semiconductor die. The semiconductor device further includes an encapsulant deposited over the first semiconductor die and second semiconductor die, a conductive pillar formed through the encapsulant, and an interconnect structure formed over the encapsulant and electrically connected to the conductive pillar. The first semiconductor die has a second thickness less than the first thickness of the first semiconductor die and the second semiconductor die has a second thickness less than the first thickness of the second semiconductor die in the semiconductor device.

In another embodiment, the present invention is a semiconductor device including a first semiconductor die having a fabrication thickness and a second semiconductor die having a fabrication thickness. The second semiconductor die is mounted to the first semiconductor die. The semiconductor device further includes an encapsulant deposited over the first semiconductor die and second semiconductor die and a first interconnect structure formed over the encapsulant. The first semiconductor die has a device thickness less than the fabrication thickness of the first semiconductor die and the second semiconductor die has a device thickness less than the fabrication thickness of the second semiconductor die in the semiconductor device.

In another embodiment, the present invention is a semiconductor device including a first semiconductor die having a fabrication thickness and a second semiconductor die having a fabrication thickness mounted to the first semiconductor die. The semiconductor device further includes an encapsulant deposited over the first semiconductor die and second semiconductor die and a first interconnect structure formed over the encapsulant. The first semiconductor die and second semiconductor die each have a reduced thickness respectively relative to the fabrication thickness in the semiconductor device.

In another embodiment, the present invention is a semiconductor device including a first semiconductor die, a second semiconductor die mounted to the first semiconductor die, and an encapsulant deposited over the first semiconductor die and second semiconductor die. The first semiconductor die and second semiconductor die each have a respective reduced thickness in the semiconductor device.

BRIEF DESCRIPTION OF THE DRAWINGS

FIGS. 3a-3l illustrate a process of forming a thin profile WLCSP with vertical interconnect capability over the entire package footprint;

DETAILED DESCRIPTION OF THE DRAWINGS

Figure 1:
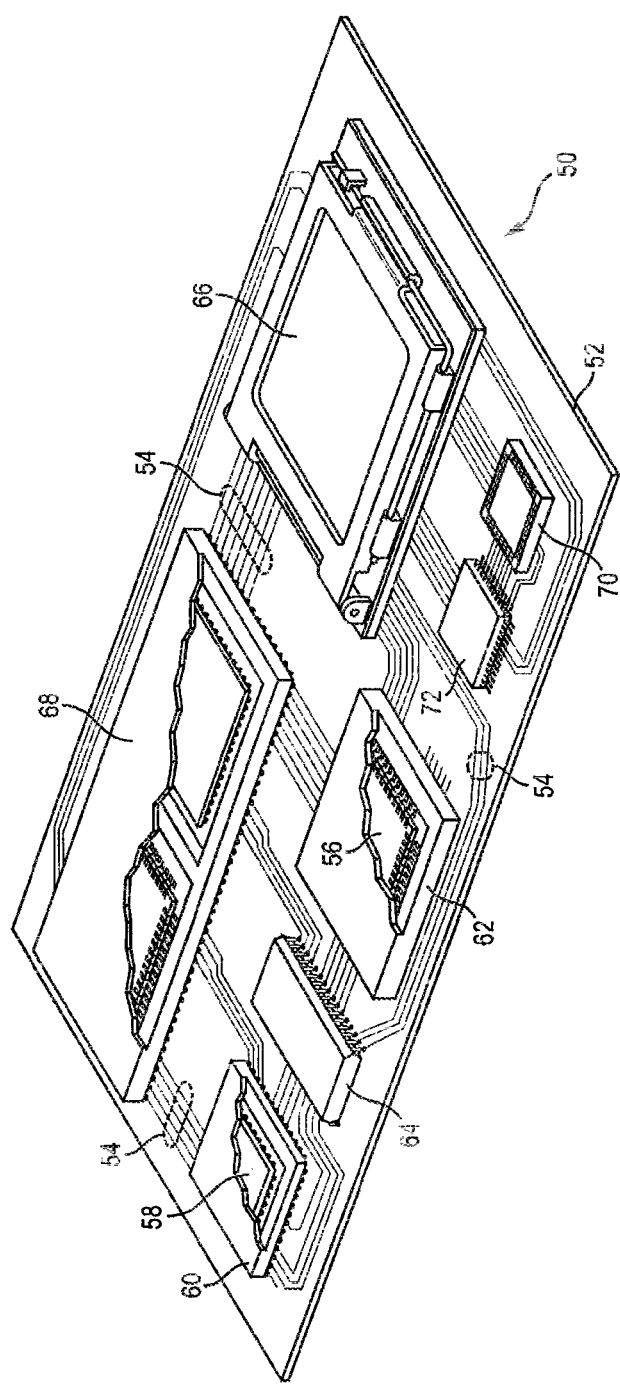
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
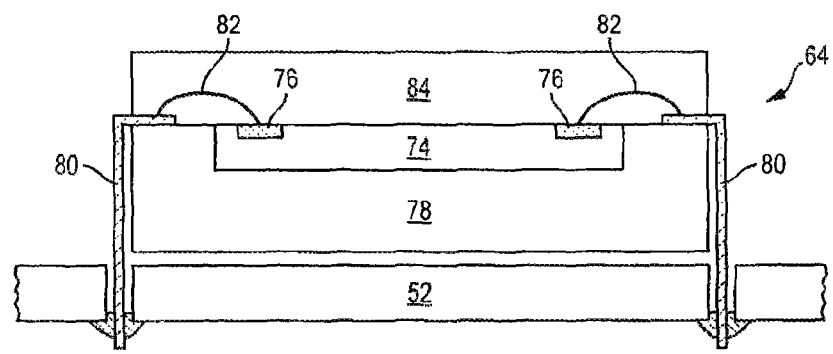
FIGS. 2a-2c illustrate further detail of the representative semiconductor packages mounted to the PCB.
Figure 2B:
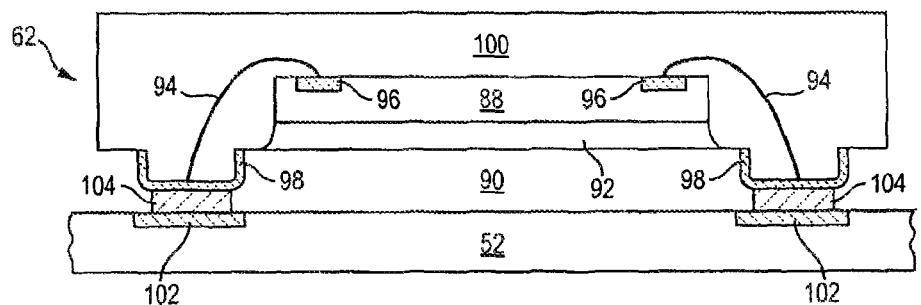
Figure 2C:
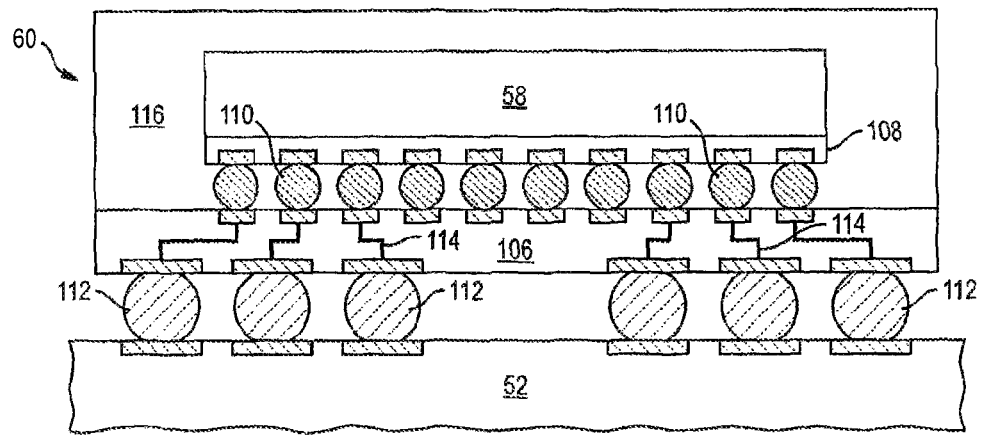

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
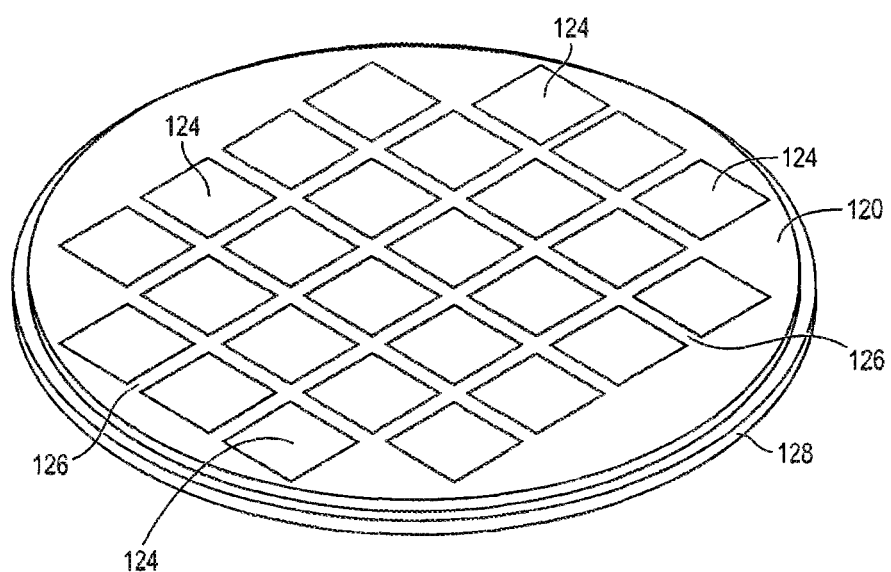

FIGS. 3a-3l illustrate, in relation to FIGS. 1 and 2a-2c, a process of forming a thin profile WLCSP containing face to face semiconductor die with vertical interconnect capability over the entire package footprint. FIG. 3a shows a semiconductor wafer 120 with a base substrate material, such as silicon, germanium, gallium arsenide, indium phosphide, or silicon carbide, for structural support. A plurality of semiconductor die or components 124 is formed on wafer 120 separated by saw streets 126 as described above. A wafer-form substrate or carrier 128 contains temporary or sacrificial base material such as silicon, polymer, polymer composite, metal, ceramic, glass, glass epoxy, beryllium oxide, or other suitable low-cost, rigid material for structural support. Wafer 120 is shown mounted to carrier 128.

Figure 3B:
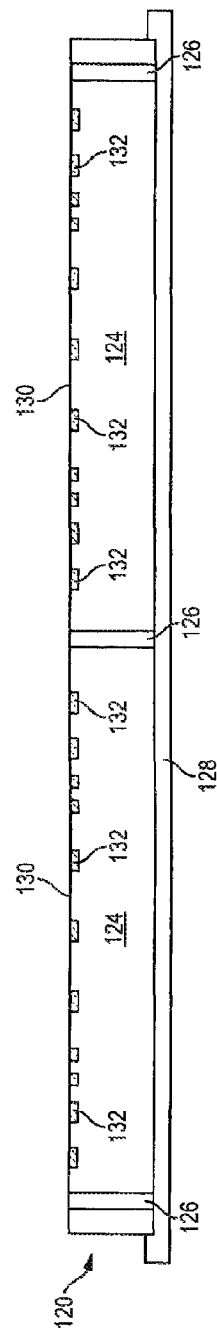

FIG. 3b shows a cross-sectional view of a portion of semiconductor wafer 120 mounted to carrier 128. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDS, such as inductors, capacitors, and resistors, for RF signal processing. Contact pads 132 are electrically connected to the circuits on active surface 130.

Figure 3C:
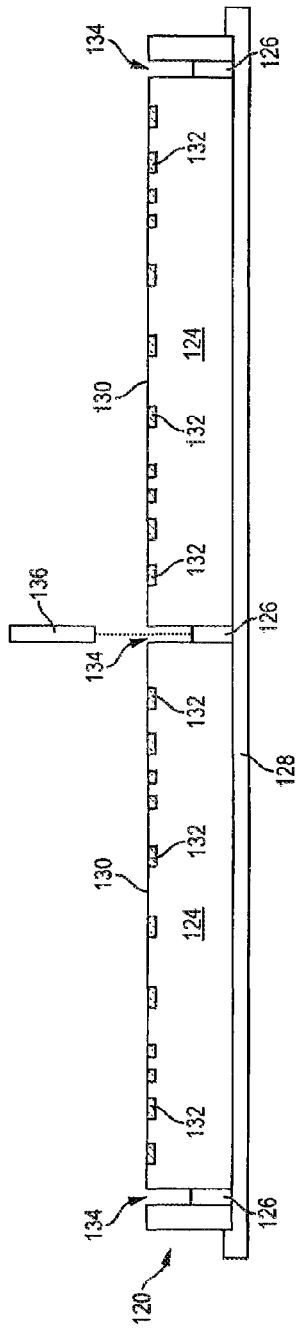

In FIG. 3c, an optional groove 134 is partially cut into saw streets 126 of semiconductor wafer 120 using a saw blade or laser cutting tool 136. Groove 134 extends only partially into saw streets 126 and does not cut completely through semiconductor wafer 120. The groove allows later deposited encapsulant to be formed on the sides of semiconductor die 124.

Figure 3D:
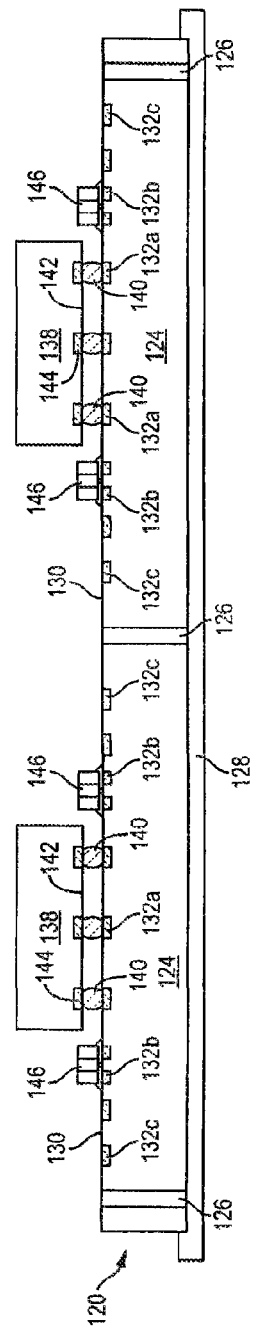

Continuing with semiconductor wafer 120 from FIG. 3b, semiconductor die 138 are mounted to contact pads 132a using bumps or microbumps 140, as shown in FIG. 3d. Semiconductor die 138 has an active surface 142 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 142 to implement analog circuits or digital circuits, such as DSP, ASIC, memory, or other signal processing circuit. Semiconductor die 138 may also contain IPDS, such as inductors, capacitors, and resistors, for RF signal processing. In one embodiment, semiconductor die 138 is a flipchip type device. Bumps 140 connect to contact pads 144 which are electrically connected to the circuits on active surface 142.

Discrete semiconductor components 146 are electrically connected to contact pads 132b on semiconductor wafer 120. Discrete semiconductor components 146 can be active devices, such as transistors and diodes, or passive devices, such as capacitors, resistors, and inductors.

In FIG. 3e, an encapsulant or molding compound 148 is deposited over semiconductor die 138 and wafer 120 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects the semiconductor device from external elements and contaminants. In the case of optional grooves 134 shown in FIG. 3c, encapsulant 148 is also deposited into the grooves to protect the sides of semiconductor die 124 after singulation.

In FIG. 3f, grinder 150 removes a portion of encapsulant 148 and bulk material from back surface 152 of semiconductor die 138, opposite active surface 142. The back surface 152 of semiconductor die 138 is co-planar with a top surface of encapsulant 148 following the grinding process.

Figure 3G:
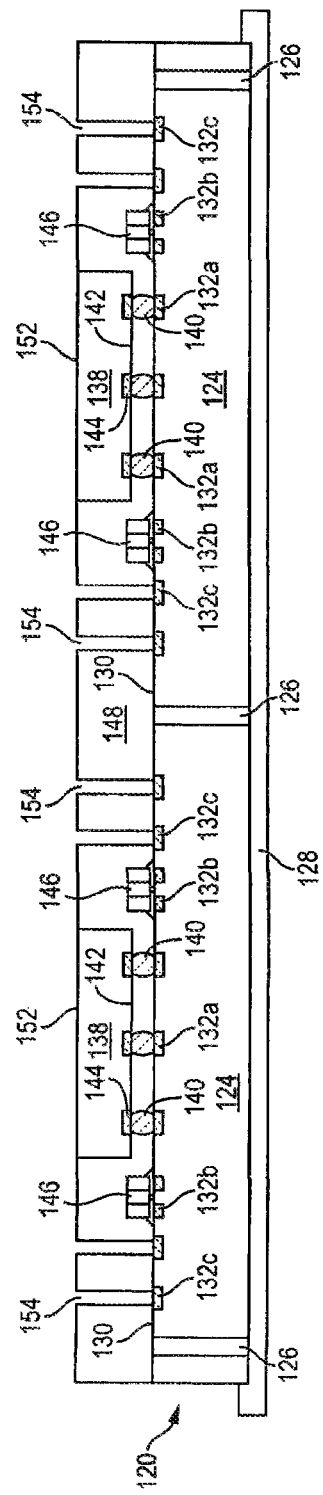
Figure 3H:
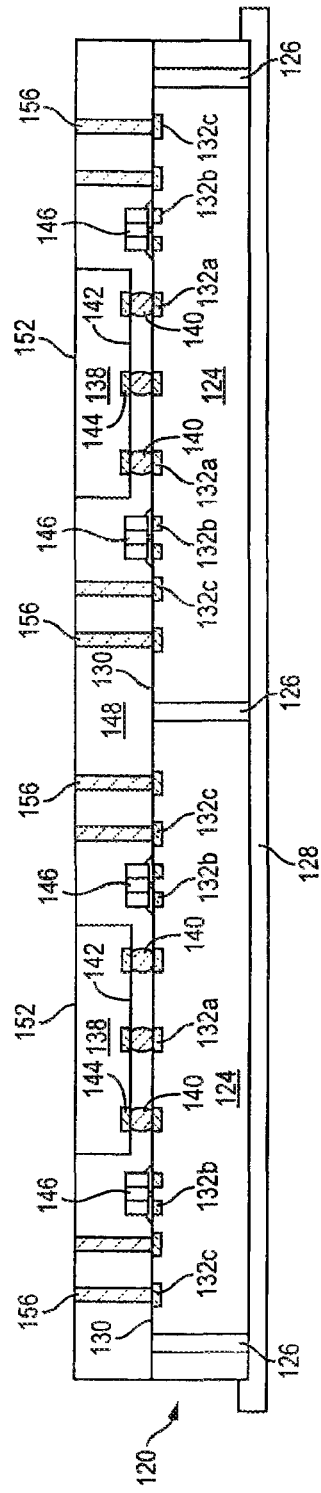

In FIG. 3g, a plurality of vias 154 is formed in encapsulant 148 over contact pads 132c using laser drilling, mechanical drilling, or deep reactive ion etching (DRIE). The vias 154 are filled with Al, Cu, Sn, Ni, Au, Ag, titanium (Ti), W, poly-silicon, or other suitable electrically conductive material using electrolytic plating, electroless plating process, or other suitable metal deposition process to form conductive pillars 156, as shown in FIG. 3h. Conductive pillars 156 have a height ranging from 20-200 micrometers (μm).

In FIG. 3i, a build-up interconnect structure 160 is formed over conductive pillars 156, semiconductor die 138, and encapsulant 148. The build-up interconnect structure 160 includes an insulating or passivation layer 162 formed by PVD, CVD, printing, spin coating, spray coating, or thermal oxidation. The insulating layer 162 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. An electrically conductive layer 164 is formed using patterning and PVD, CVD, electrolytic plating, electroless plating process, or other suitable metal deposition process. Conductive layer 164 can be one or more layers of Al, Cu, Sn, Ni, Au, Ag, or other suitable electrically conductive material. Conductive layer 164 is electrically connected to conductive pillars 156 and, in part, operates as a redistribution layer (RDL) to extend the electrical connectivity of the conductive pillars.

In one embodiment, an integrated passive device (IPDS), such a capacitor, resistor, or inductor, can be formed in build-up interconnect structure 160.

In FIG. 3j, a substrate or carrier 168 contains temporary or sacrificial base material such as silicon, polymer, polymer composite, metal, ceramic, glass, glass epoxy, beryllium oxide, or other suitable low-cost, rigid material for structural support. The assembly described in FIGS. 3a-3i is inverted and, leading with build-up interconnect structure 160, mounted to carrier 168. The temporary carrier 128 is removed by chemical etching, mechanical peel-off, CMP, mechanical grinding, thermal bake, laser scanning, or wet stripping.

Figure 3K:
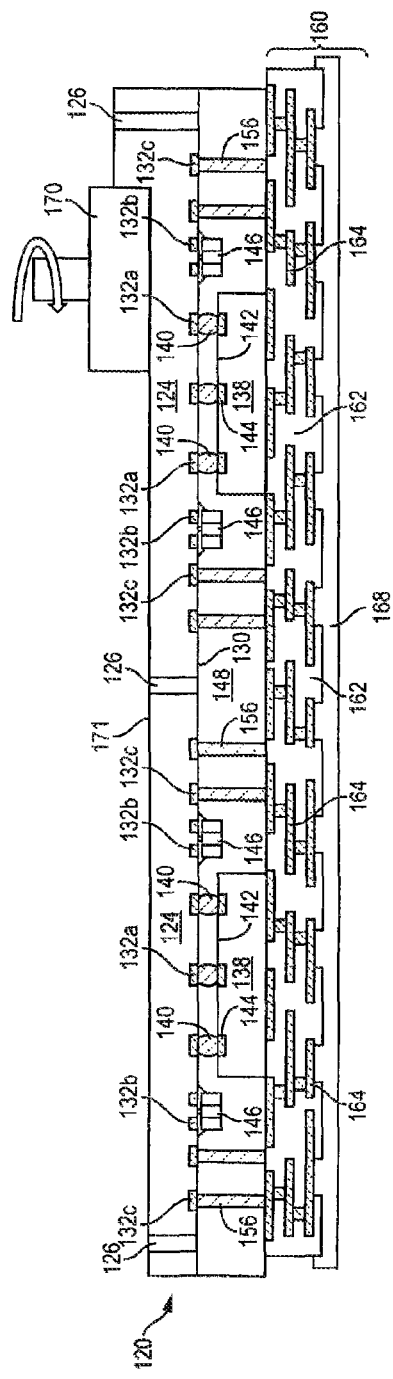

In FIG. 3k, grinder 170 removes excess bulk material from back surface 171 of semiconductor die 124, opposite active surface 130.

Figure 3L:
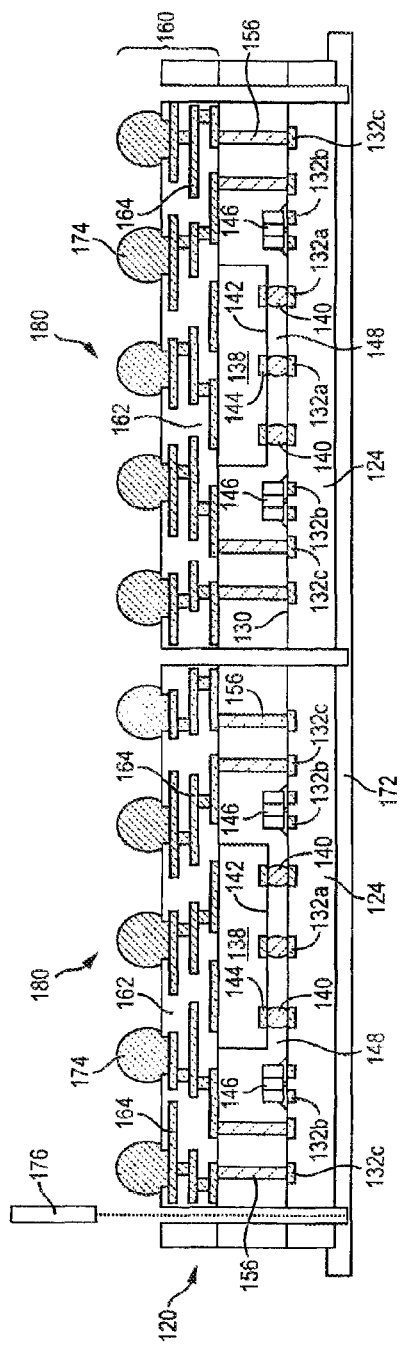

In FIG. 3l, a substrate or carrier 172 contains temporary or sacrificial base material such as silicon, polymer, polymer composite, metal, ceramic, glass, glass epoxy, beryllium oxide, or other suitable low-cost, rigid material for structural support. The assembly described in FIG. 3k is inverted and, leading with semiconductor die 124, mounted to carrier 172. The temporary carrier 168 is removed by chemical etching, mechanical peel-off, CMP, mechanical grinding, thermal bake, laser scanning, or wet stripping.

An electrically conductive bump material is deposited over conductive layer 164 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 164 using a suitable attachment or bonding process. In one embodiment, the bump material is reflowed by heating the material above its melting point to form spherical balls or bumps 174. In some applications, bumps 174 are reflowed a second time to improve electrical contact to conductive layer 164. The bumps can also be compression bonded to conductive layer 164. Bumps 174 represent one type of interconnect structure that can be formed over conductive layer 164. The interconnect structure can also use bond wires, conductive paste, stud bump, micro bump, or other electrical interconnect.

Semiconductor wafer 120 is singulated through saw streets 126 with saw blade or laser cutting tool 176, as shown in FIG. 3l. The cut through semiconductor wafer 120 continues only partially into carrier 172. The temporary carrier 172 is removed by chemical etching, mechanical peel-off, CMP, mechanical grinding, thermal bake, laser scanning, or wet stripping to complete separation of the individual WLCSP 180.

Figure 4:
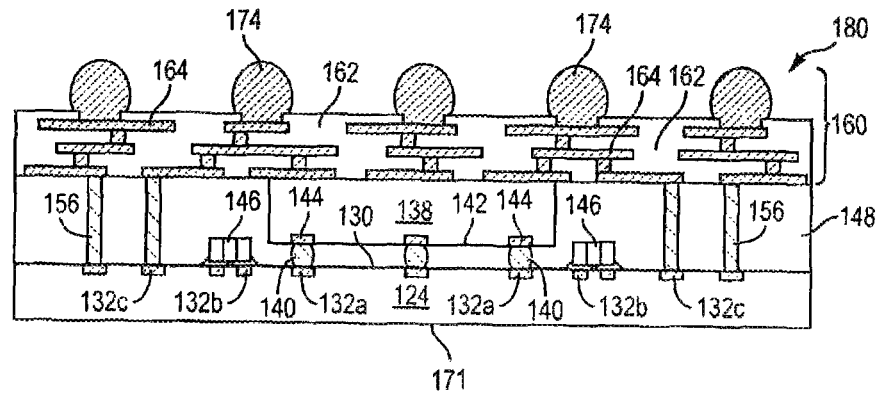
FIG. 4 illustrates the thin profile WLCSP with vertical interconnect capability over the entire package footprint.

FIG. 4 shows WLCSP 180 after singulation. WLCSP 180 is made using the face to face (F2F) die to wafer (D2W) bonding process, as described in FIGS. 3a-3l. WLCSP 180 has a thin package profile due to the die back-grinding process of semiconductor die 124 and 138 after die attach and encapsulation process, see FIGS. 3f and 3k. The back-grinding after die attach and encapsulation make for a thin robust package which is less susceptible to defects during handling. Conductive pillars 156 provide electrical interconnect between semiconductor die 124 and 138 and build-up interconnect structure 160. Semiconductor die 124 is electrically connected to semiconductor die 138 with bumps 140 and contact pads 132a and 144. Build-up interconnect structure 160 provides a full array interconnect foot-print, both around a perimeter of the lower semiconductor die 124 and within the footprint of the lower semiconductor die. That is, the combination of conductive pillars 156 and build-up interconnect structure 160 allows the entire foot-print of WLCSP 180 to be used for vertical interconnect while maintaining a thin package profile.

Figure 5:
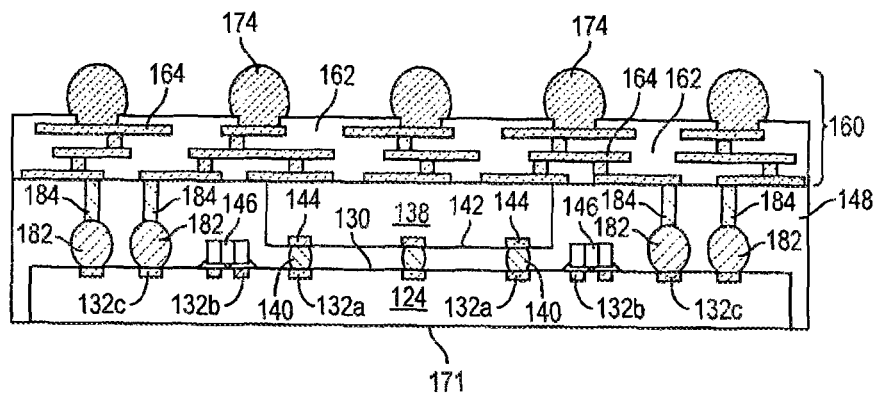
FIG. 5 illustrates bumps and conductive pillars formed in the encapsulant for vertical interconnect.

FIG. 5 shows an embodiment similar to FIG. 4 with bumps 182 and conductive pillars 184 formed within encapsulant 148 between contact pads 132c and conductive layer 164 of build-up interconnect structure 160. In this embodiment, encapsulant 148 covers the sides of semiconductor die 124 by using grooves 134 as per FIG. 3c.

Figure 6:
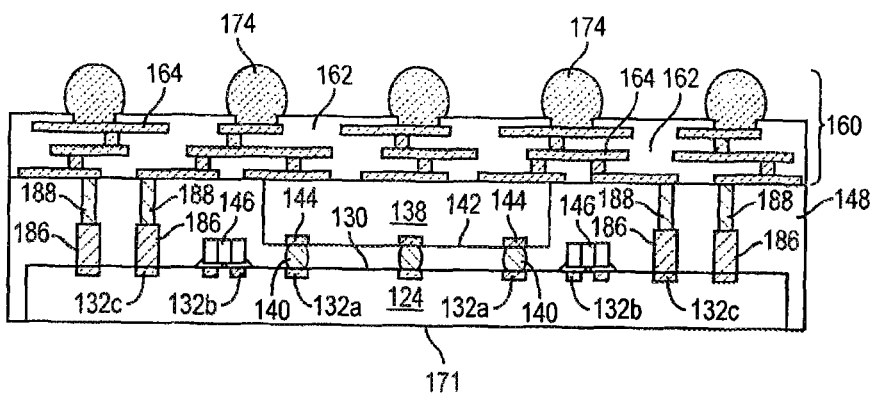
FIG. 6 illustrates posts and conductive pillars formed in the encapsulant for vertical interconnect.

FIG. 6 shows an embodiment similar to FIG. 4 with posts 186 and conductive pillars 188 formed within encapsulant 148 between contact pads 132c and conductive layer 164 of build-up interconnect structure 160. In this embodiment, encapsulant 148 covers the sides of semiconductor die 124 by using grooves 134 as per FIG. 3c.

Figure 7:
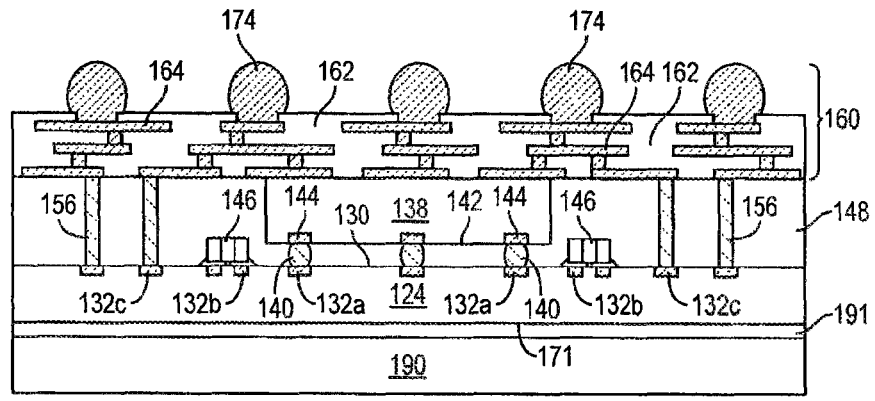
FIG. 7 illustrates a heat sink mounted to the lower semiconductor die of the WLCSP.

FIG. 7 shows an embodiment similar to FIG. 4 with a heat sink 190 and optional thermal interface material (TIM) 191 mounted over back surface 171 of semiconductor die 124. Heat sink 190 can be Al, Cu, or another material with high thermal conductivity to provide heat dissipation for semiconductor die 124. TIM 191 can be aluminum oxide, zinc oxide, boron nitride, or pulverized silver. TIM 191 aids in the distribution and dissipation of heat generated by semiconductor die 124.

Figure 8A:
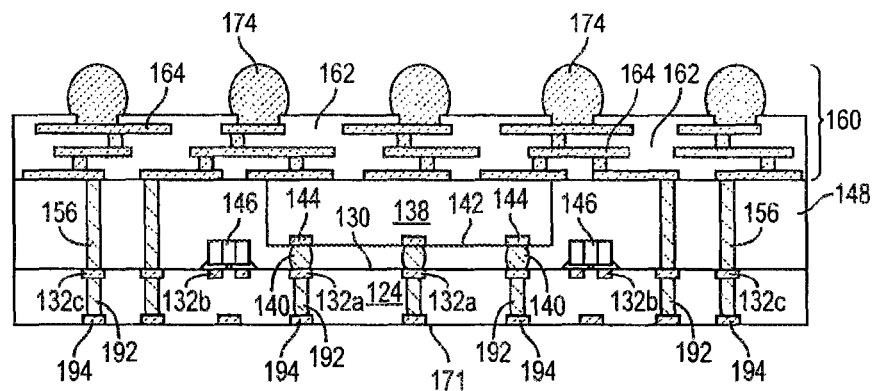
FIGS. 8a-8b illustrate TSV formed in the lower semiconductor die of the WLCSP.

FIG. 8a shows an embodiment similar to FIG. 4 with conductive through silicon vias (TSV) 192 formed through semiconductor die 124. A plurality of vias is formed through semiconductor die 124 over contact pads 132c using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TSV 192 for vertical interconnectivity. Contact pads 194 are formed over back surface 171 of semiconductor die 124 and electrically connected to TSVs 192.

Figure 8B:
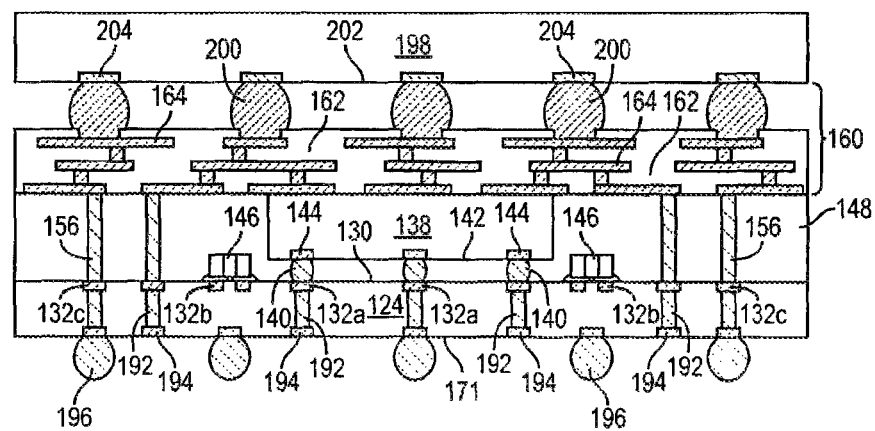

In FIG. 8b, an electrically conductive bump material is deposited over conductive pads 194 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pads 194 using a suitable attachment or bonding process. In one embodiment, the bump material is reflowed by heating the material above its melting point to form spherical balls or bumps 196. In some applications, bumps 196 are reflowed a second time to improve electrical contact to conductive pads 194. The bumps can also be compression bonded to conductive pads 194. Bumps 196 represent one type of interconnect structure that can be formed over conductive pads 194. The interconnect structure can also use bond wires, conductive paste, stud bump, micro bump, or other electrical interconnect.

A semiconductor die 198 is mounted to build-up interconnect structure 160 with bumps 200. Semiconductor die 198 has an active surface 202 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 202 to implement analog circuits or digital circuits, such as DSP, ASIC, memory, or other signal processing circuit. Semiconductor die 198 may also contain IPDS, such as inductors, capacitors, and resistors, for RF signal processing. In one embodiment, semiconductor die 198 is a flipchip type device. Bumps 200 connect to contact pads 204 which are electrically connected to the circuits on active surface 202.

Figure 9:
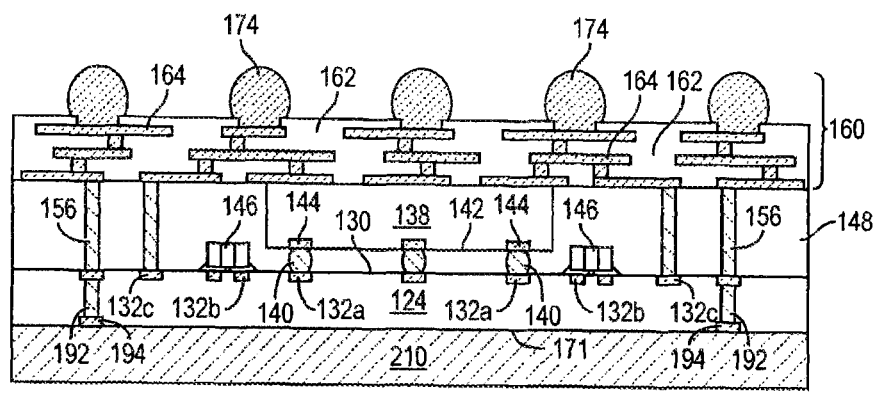
FIG. 9 illustrates a shielding layer mounted to the lower semiconductor die in the WLCSP.

FIG. 9 shows an embodiment similar to FIG. 8a with a shielding layer 210 formed over back surface 171 of semiconductor die 124. Shielding layer 210 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 210 can also be a non-metal material such as carbon-black or aluminum flake to reduce the effects of EMI and RFI. Shielding layer 210 is grounded through contact pads 194, TSVs 192, conductive pillars 156, and build-up interconnect structure 160.

Figure 10:
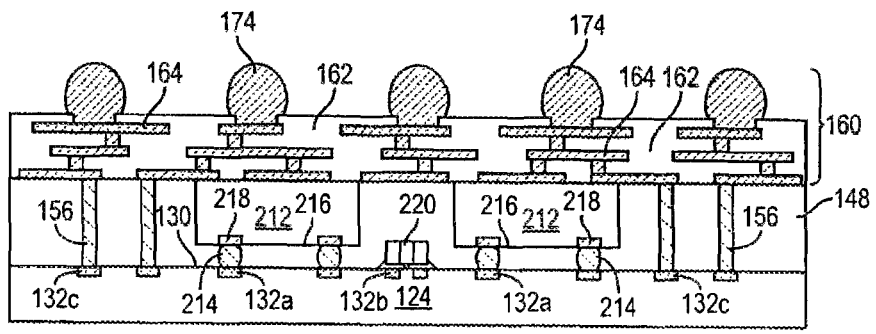
FIG. 10 illustrates side-by-side semiconductor die mounted face to face with lower semiconductor die in the WLCSP.

FIG. 10 shows an embodiment continuing from FIG. 3b with two side-by-side semiconductor die 212 mounted to contact pads 132a using bumps or microbumps 214. Semiconductor die 212 has an active surface 216 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 216 to implement analog circuits or digital circuits, such as DSP, ASIC, memory, or other signal processing circuit. Semiconductor die 212 may also contain IPDS, such as inductors, capacitors, and resistors, for RF signal processing. In one embodiment, semiconductor die 212 is a flipchip type device. Bumps 214 connect to contact pads 218 which are electrically connected to the circuits on active surface 216.

Discrete semiconductor component 220 is electrically connected to contact pads 132b on semiconductor wafer 120. Discrete semiconductor components 220 can be active devices, such as transistors and diodes, or passive devices, such as capacitors, resistors, and inductors.

Figure 11A:
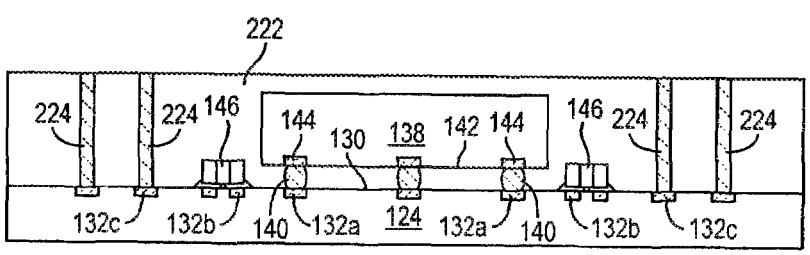
FIGS. 11a-11d illustrate another process of forming conductive pillars in the encapsulant.

FIGS. 11a-11d show another process of forming conductive pillars through the encapsulant. Continuing from FIG. 3d, a photoresist layer 222 is deposited over semiconductor die 138 and semiconductor wafer 120, as shown in FIG. 11a. A portion of photoresist layer 222 over contact pads 132c is exposed and removed by an etching process. Conductive material such as Cu, Al, tungsten (W), Au, or solder is formed in the removed portion of the photoresist using an electrolytic plating, electroless plating, or selective plating process. The photoresist layer 222 is stripped away leaving conductive pillars 224 having a height ranging from 20-200 µm. In another embodiment, stud bumps are stacked over contact pads 132c.

Figure 11B:
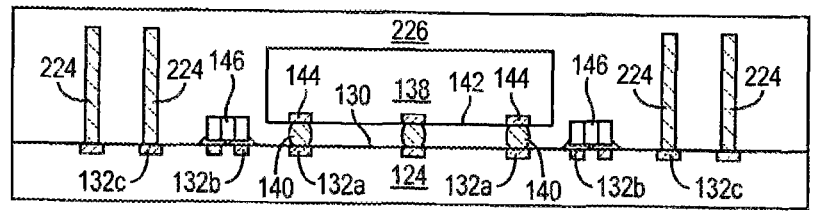

In FIG. 11b, an encapsulant or molding compound 226 is deposited over semiconductor die 138 and wafer 120 using a paste printing, compressive molding, transfer molding, liquid encapsulant molding, vacuum lamination, spin coating, or other suitable applicator. Encapsulant 226 can be polymer composite material, such as epoxy resin with filler, epoxy acrylate with filler, or polymer with proper filler. Encapsulant 226 is non-conductive and environmentally protects the semiconductor device from external elements and contaminants.

Figure 11C:
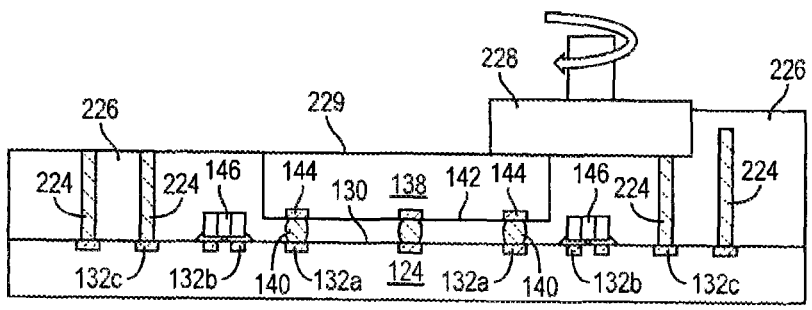
Figure 11D:
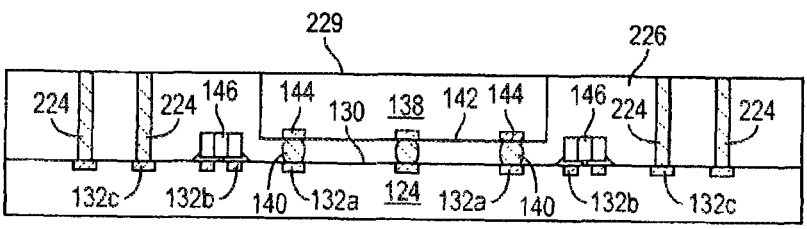

In FIG. 11c, grinder 228 removes a portion of encapsulant 226 and bulk material from back surface 229 of semiconductor die 138, opposite active surface 142. The back surface 229 of semiconductor die 138 is co-planar with a top surface of encapsulant 226 following the grinding process, as shown in FIG. 11d. The assembly process continues with FIG. 3i-3l resulting in a WLCSP similar to FIG. 4.

Figure 12A:
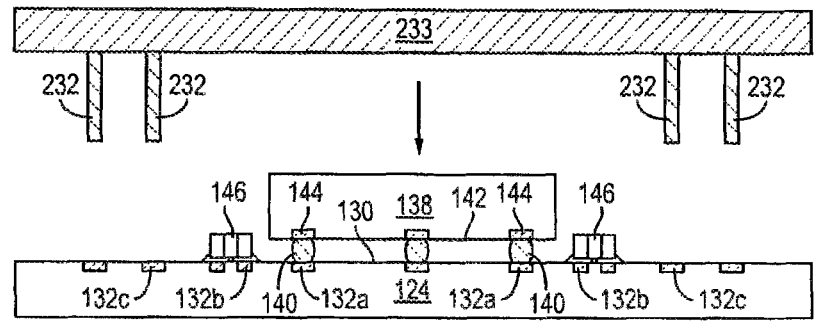
FIGS. 12a-12e illustrate a leadframe interposer to form conductive pillars in the encapsulant.
Figure 12B:
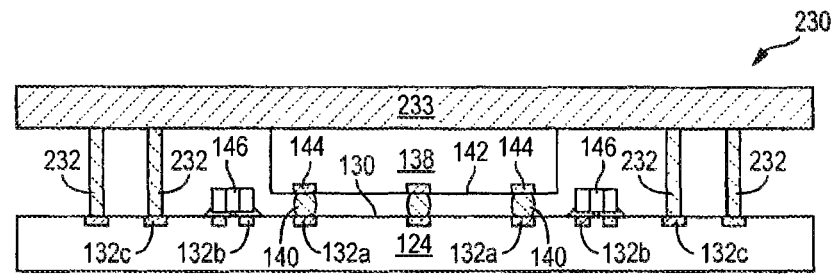
Figure 12C:
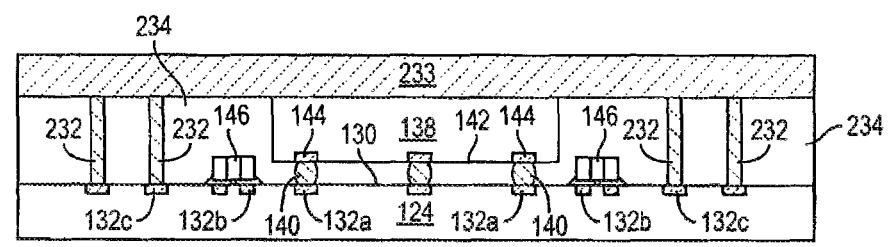
Figure 12D:
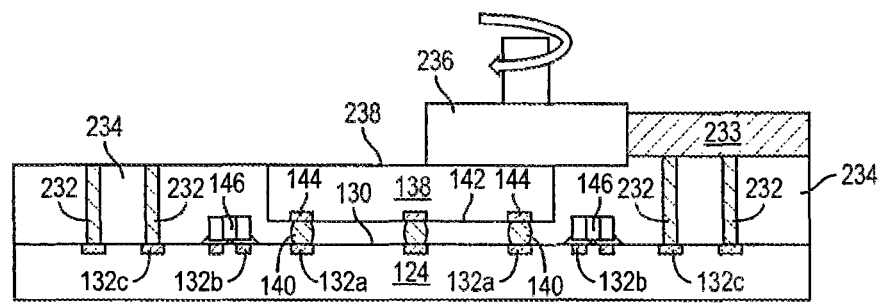
Figure 12E:
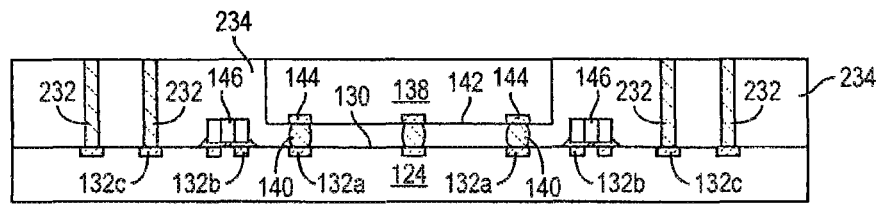

FIGS. 12a-12e show another process of forming conductive pillars through the encapsulant. Continuing from FIG. 3d, a leadframe interposer 230 is mounted over semiconductor die 138 to contact pads 132c on semiconductor wafer 120, as shown in FIGS. 12a-12b. Leadframe interposer 230 include vertical segments or bodies 232 extending from plate 233 to contact pads 132c. In FIG. 12c, an encapsulant or molding compound 234 is deposited under leadframe interposer 120 and over semiconductor die 138 and wafer 120 using a paste printing, compressive molding, transfer molding, liquid encapsulant molding, vacuum lamination, spin coating, or other suitable applicator. Encapsulant 234 can be polymer composite material, such as epoxy resin with filler, epoxy acrylate with filler, or polymer with proper filler. Encapsulant 234 is non-conductive and environmentally protects the semiconductor device from external elements and contaminants. In FIG. 12d, grinder 236 removes plate 233 and a portion of encapsulant 234 and bulk material from back surface 238 of semiconductor die 138, opposite active surface 142. The back surface 238 of semiconductor die 138 is co-planar with a top surface of encapsulant 234 following the grinding process, as shown in FIG. 12e. The remaining bodies 232 constitute conductive pillars in encapsulant 234 after the grinding process. The assembly process continues with FIG. 3i-3l resulting in a WLCSP similar to FIG. 4.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first semiconductor die including a first thickness during fabrication;
   a second semiconductor die including a first thickness during fabrication and an active surface of the second semiconductor die disposed over an active surface of the first semiconductor die;
   an encapsulant deposited over the first semiconductor die and second semiconductor die;
   a conductive pillar formed through the encapsulant within a footprint of the first semiconductor die;
   a build-up interconnect structure including an insulating layer and a redistribution layer each formed directly on the encapsulant and a non-active surface of the second semiconductor die, the redistribution layer of the build-up interconnect structure directly contacting the conductive pillar;
   wherein the first semiconductor die includes a second thickness less than the first thickness of the first semiconductor die and the second semiconductor die includes a second thickness less than the first thickness of the second semiconductor die in the semiconductor device; and
   a contact pad formed on a non-active surface of the first semiconductor die, the contact pad electrically connected to the conductive pillar and the build-up interconnect structure.

2. The semiconductor device of claim 1, further including a discrete semiconductor component disposed over the first semiconductor die.

3. The semiconductor device of claim 1, wherein the conductive pillar includes a post, bump, or microbump.

4. The semiconductor device of claim 1, further including a heat sink or shielding layer disposed over the first semiconductor die, the shielding layer electrically connected to the contact pad.

5. The semiconductor device of claim 1, further including an interconnect structure disposed over the contact pad on the non-active surface of the first semiconductor die opposite the active surface of the first semiconductor die.

6. The semiconductor device of claim 1, further including a third semiconductor die disposed over the first semiconductor die and the non-active surface of the second semiconductor die.

7. A semiconductor device, comprising:
   a first semiconductor die;
   a second semiconductor die disposed over the first semiconductor die;
   an encapsulant deposited over the first semiconductor die and second semiconductor die, the encapsulant coplanar with a non-active surface of the second semiconductor die;
   a first interconnect structure formed through the encapsulant and extending to the first semiconductor die; and
   a build-up interconnect structure including an insulating layer and a redistribution layer each formed in direct contact with the encapsulant and the non-active surface of the second semiconductor die, the build-up interconnect structure directly contacting the first interconnect structure.

8. The semiconductor device of claim 7, further including a third semiconductor die disposed over the first semiconductor die.

9. The semiconductor device of claim 7, further including a discrete semiconductor device disposed over the first semiconductor die.

10. The semiconductor device of claim 7, further including a third semiconductor die disposed over the first interconnect structure.

11. The semiconductor device of claim 7, further including a second interconnect structure disposed over a surface of the first semiconductor die opposite an active surface of the first semiconductor die.

12. The semiconductor device of claim 11, further including the encapsulant deposited around the first and second semiconductor die.

13. The semiconductor device of claim 7, further including a heat sink or shielding layer disposed over the first semiconductor die.

14. A semiconductor device, comprising:
a first semiconductor die including a contact pad;
a second semiconductor die disposed over the contact pad of the first semiconductor die;
an encapsulant deposited over the first semiconductor die and second semiconductor die, the encapsulant coplanar with a non-active surface of the second semiconductor die;
a first interconnect structure formed through the encapsulant over the first semiconductor die; and
a second interconnect structure including an insulating layer and a conductive layer each formed in direct contact with the encapsulant and second semiconductor die, the conductive layer formed in direct contact with the first interconnect structure.

15. The semiconductor device of claim 14, further including a third semiconductor die including a fabrication thickness disposed over the first semiconductor die, the third semiconductor die including a reduced thickness relative to the fabrication thickness in the semiconductor device.

16. The semiconductor device of claim 14, further including a discrete semiconductor device disposed over the first semiconductor die.

17. The semiconductor device of claim 14, wherein the first interconnect structure includes a conductive pillar, post, bump, or microbump.

18. The semiconductor device of claim 14, further including a third semiconductor die disposed over the encapsulant.

19. The semiconductor device of claim 14, further including a third interconnect structure disposed over a surface of the first semiconductor die opposite an active surface of the first semiconductor die.

* * * * *